(12) United States Patent
Lee

(10) Patent No.: US 6,998,662 B2
(45) Date of Patent: Feb. 14, 2006

(54) METHOD OF MAKING A MAGNETIC TUNNEL JUNCTION DEVICE

(75) Inventor: Heon Lee, Pohang-Si (KR)

(73) Assignee: Hewlett-Packard Development Company, L.P., Houston, TX (US)

( * ) Notice: Subject to any disclaimer, the term of this patent is extended or adjusted under 35 U.S.C. 154(b) by 148 days.

(21) Appl. No.: 11/080,092

(22) Filed: Mar. 14, 2005

(65) Prior Publication Data

US 2005/0156215 A1    Jul. 21, 2005

Related U.S. Application Data

(62) Division of application No. 10/692,612, filed on Oct. 24, 2003.

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. .................. 257/295; 257/421; 257/427

(58) Field of Classification Search ................ 257/295, 257/296, 421, 422, 423, 424, 425, 426, 427, 257/659
See application file for complete search history.

(56) References Cited

U.S. PATENT DOCUMENTS 5,841,692 A * 11/1998 Gallagher et al. .......... 365/173
6,475,857 B1 * 11/2002 Kim et al. .................. 438/240

* cited by examiner

*Primary Examiner*—Phuc T. Dang
(74) *Attorney, Agent, or Firm*—Trueman H Denny

(57) ABSTRACT

A method of making a magnetic tunnel junction device is disclosed. The magnetic tunnel junction device includes a magnetic tunnel junction stack and an electrically non-conductive spacer in contact with a portion of the magnetic tunnel junction stack. The spacer electrically insulates a portion of the magnetic tunnel junction stack from an electrically conductive material used for a via that is in contact with the magnetic tunnel junction stack and a top conductor. The spacer can also prevent an electrical short between a bottom conductor and the top conductor. The spacer can prevent electrical shorts when the magnetic tunnel junction stack and a self-aligned via are not aligned with each other.

6 Claims, 12 Drawing Sheets

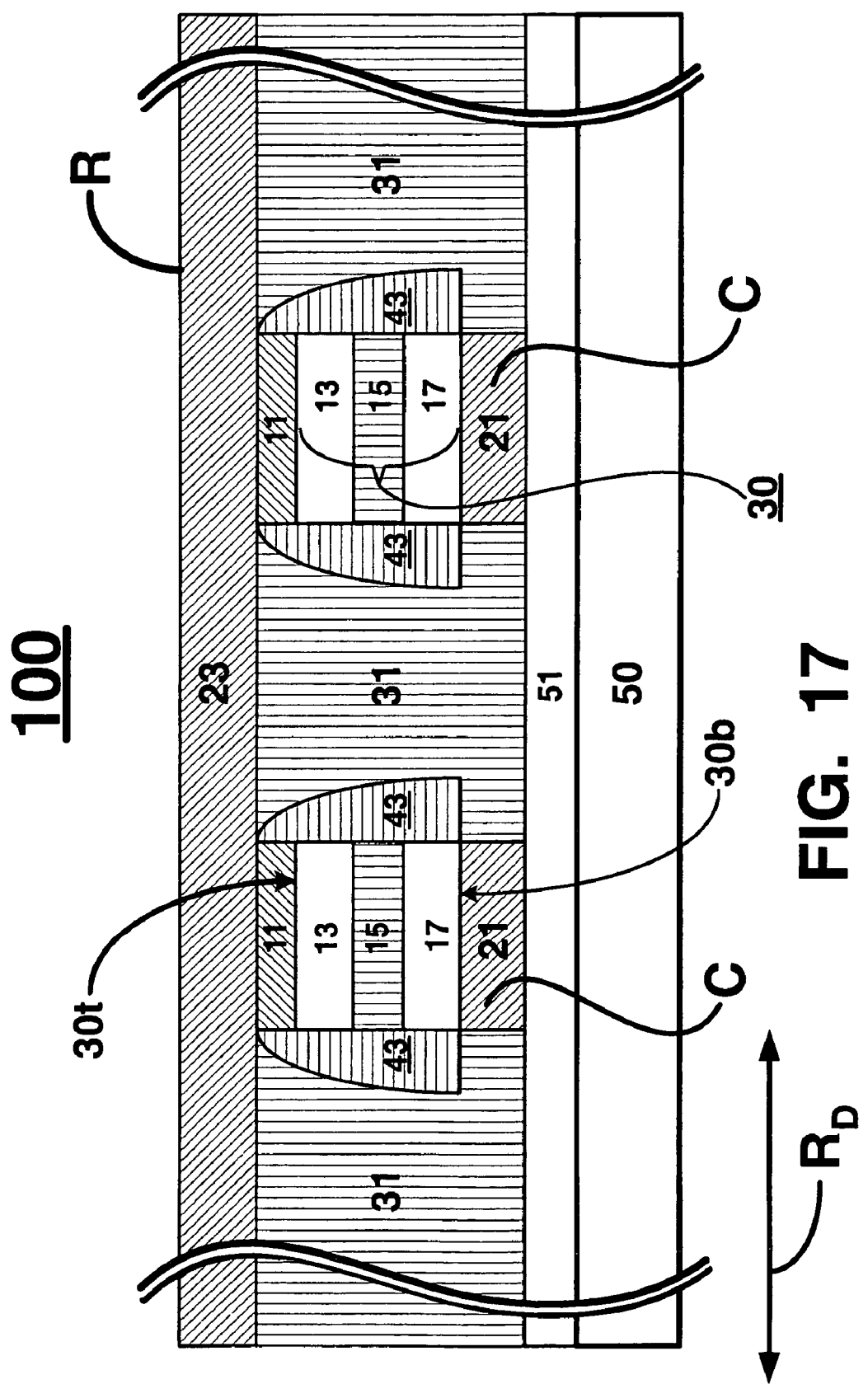

METHOD OF MAKING A MAGNETIC TUNNEL JUNCTION DEVICE

This is a division of U.S. application Ser. No. 10/692,612, filed Oct. 24, 2003.

FIELD OF THE INVENTION

The present invention relates generally to a method of making a magnetic tunnel junction device. More specifically, the present invention relates to a method of making a magnetic tunnel junction device that includes an electrically non-conductive spacer.

BACKGROUND OF THE INVENTION

An magnetoresistance random access memory (MRAM) includes an array of memory cells. Each memory cell is a magnetic tunnel junction device. The magnetic tunnel junction device operates on the principles of spin tunneling. There are several types of magnetic tunnel junction devices including two prominent types, tunneling magnetoresistance (TMR) and giant magnetoresistance (GMR). Both types of devices comprise several layers of thin film materials and include a first layer of magnetic material in which a magnetization is alterable and a second layer of magnetic material in which a magnetization is fixed or "pinned" in a predetermined direction. The first layer is commonly referred to as a data layer or a sense layer; whereas, the second layer is commonly referred to as a reference layer or a pinned layer. The data layer and the reference layer are separated by a very thin tunnel barrier layer. In a TMR device, the tunnel barrier layer is a thin film of a dielectric material (e.g. silicon oxide $SiO_2$). In contrast, in a GMR device, the tunnel barrier layer is a thin film of an electrically conductive material (e.g. copper Cu).

Electrically conductive traces, commonly referred to as word lines and bit lines, or collectively as write lines, are routed across the array of memory cells with a memory cell positioned at an intersection of a word line and a bit line. The word lines can extend along rows of the array and the bit lines can extend along columns of the array, or vice-versa. A single word line and a single bit line are selected and operate in combination to switch the alterable orientation of magnetization in the memory cell located at the intersection of the word line and the bit line. A current flows through the selected word and bit lines and generates magnetic fields that collectively acts on the alterable orientation of magnetization to cause it to switch (i.e. flip) from a current state (i.e. a logic zero "0") to a new state (i.e. a logic "1").

One problem in prior magnetic tunnel junction devices is that the electrically conductive materials that are used for the write lines can become shorted to each other and/or can cause a short between the data and reference layers. As a result, the short causes a resistance of the prior magnetic tunnel junction device to be too low and therefore the state of the alterable orientation of magnetization cannot be sensed by measuring a resistance across the magnetic tunnel junction device or by sensing a magnitude of current flow through the magnetic tunnel junction device. Consequently, the short is a defect that renders the magnetic tunnel junction device inoperable.

In FIG. 1, a prior magnetic tunnel junction device 200 includes a magnetic tunnel junction stack 230 that is crossed by and positioned between a column conductor 201 and a row conductor 213. A current Ix flowing in the column conductor 201 generates a magnetic field Hy and a current ly flowing in the row conductor 213 generates a magnetic field Hx. The combined effect of the magnetic fields (Hy, Hx) acting on the alterable orientation of magnetization causes the alterable orientation to flip if a combined magnitude of the magnetic fields (Hy, Hx) is of a sufficient magnitude.

One disadvantage of the prior magnetic tunnel junction device 200 is that shorts created during a manufacturing of the device can significantly reduce manufacturing yields. For example, if during the manufacturing of the prior magnetic tunnel junction device 200, some of the material for the column conductor 201 comes into contact with the row conductor 213 or comes into contact with a side 230c of the magnetic tunnel junction stack 230, then the magnetic tunnel junction device 200 is defective due to a short circuit.

In FIG. 2, the prior magnetic tunnel junction stack 230 can include a pinned layer 209 of a magnetic material (e.g. made from nickel iron NiFe) and including a pinned orientation of magnetization (not shown), a tunnel barrier layer 207 (e.g made from aluminum oxide $Al_2O_3$ for a TMR device), and a data layer 205 of a magnetic material (e.g. made from nickel iron cobalt NiFeCo) and including an alterable orientation of magnetization (not shown). During manufacturing, a pattern formed by a mask layer 220 is formed on a dielectric layer 221. Ideally, as depicted by dashed lines I, the pattern formed by the mask 220 would be perfectly aligned with the magnetic tunnel junction stack 230. However, in reality, there are errors introduced by the machines and the fabrication processes used to manufacture the prior magnetic tunnel junction device 200. As a result, an actual misalignment depicted by dashed lines A can occur.

In FIG. 3, the dielectric layer 221 is etched through the mask layer 220 to form a via 233 in the dielectric layer 221. Due to the misalignment, the via 233 extends beyond a top portion of the magnetic tunnel junction stack 230 and exposes a side portion 233m of the magnetic tunnel junction stack 230.

In FIG. 4a, during a metal deposition step, an electrically conductive material 235 fills in the misaligned via 233 including those portions in the side portion 233m which creates a short 235s between the magnetic tunnel junction stack 230 and the row conductor 213. In FIG. 4b, the column conductor 201 is formed on the electrically conductive material 235 resulting in a short 235t between the row and column conductors (213, 201) and the magnetic tunnel junction stack 230.

Consequently, there is a need for a method of making a magnetic tunnel junction device that reduces the potential for electrical shorts due to misalignment of a via relative to a magnetic tunnel junction stack.

SUMMARY OF THE INVENTION

The present invention is embodied in a method of making a magnetic tunnel junction device. The magnetic tunnel junction device solves the aforementioned problem of shorts between a conductor and a magnetic tunnel junction stack by forming a spacer around a portion of a magnetic tunnel junction stack. The spacer is made from a dielectric material that electrically insulates those portions of the magnetic tunnel junction stack that are in contact with the spacer. The spacer can also prevent electrical shorts between the conductors (e.g. the write lines) that are used to read data from and write data to the magnetic tunnel junction device.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 17 is a cross-sectional view along line A—A of FIG. 16.

DETAILED DESCRIPTION

Figure 1:
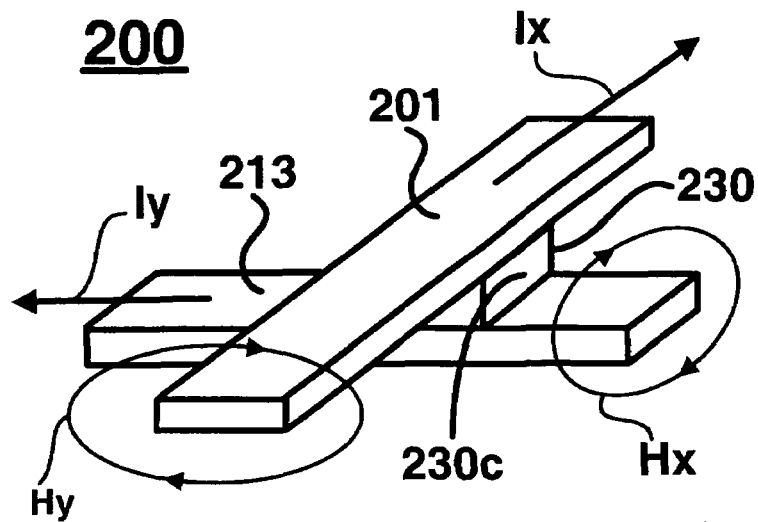
FIG. 1 is a profile view depicting a prior magnetic tunnel junction device crossed by a pair of write lines.
Figure 2:
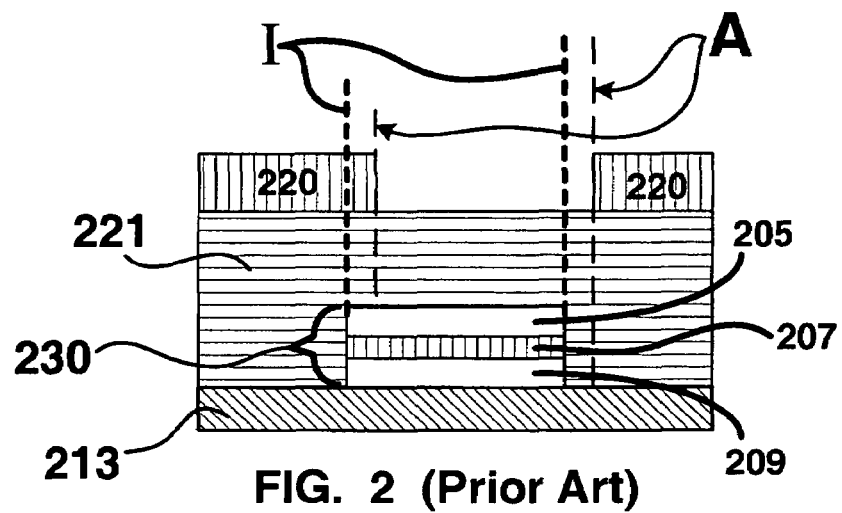
FIG. 2 is a cross-sectional view depicting an ideal and an actual alignment of a via in a prior magnetic tunnel junction stack.
Figure 3:
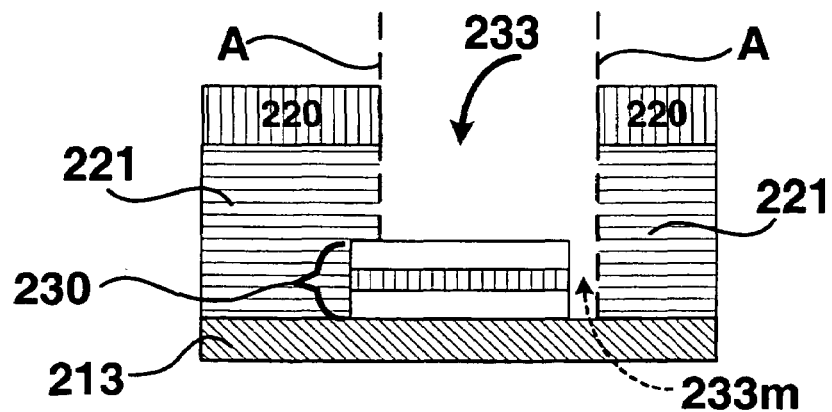
FIG. 3 is a cross-sectional view depicting an ideal and an actual alignment of a via in a prior magnetic tunnel junction stack.
Figure 4A:
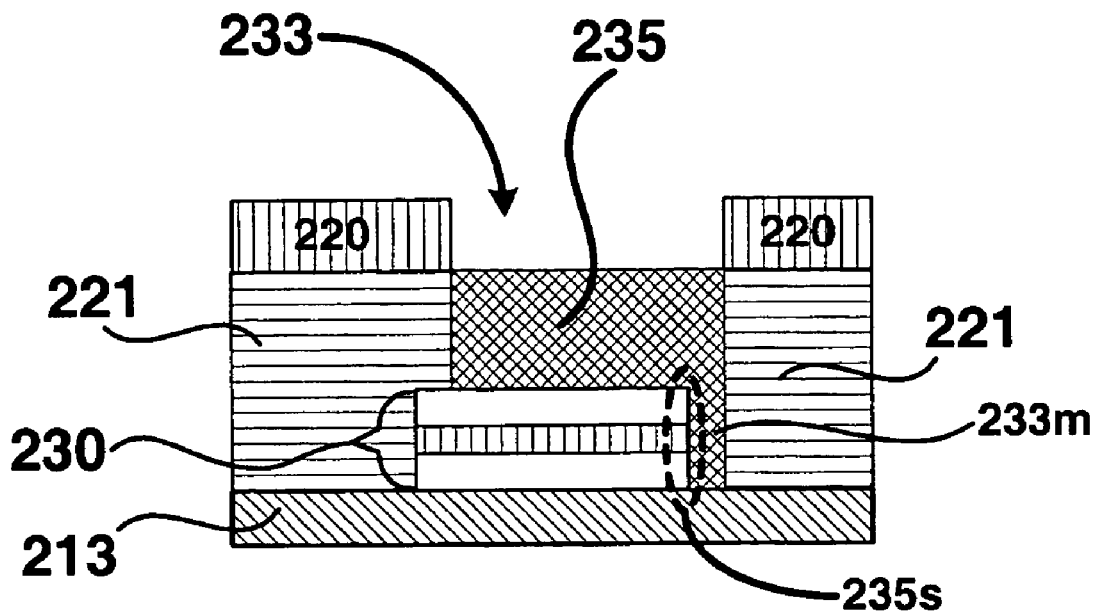
FIGS. 4a and 4b are a cross-sectional views depicting an electrical short caused by the mis-aligned via of the prior magnetic tunnel junction stack of FIG. 3.
Figure 4B:
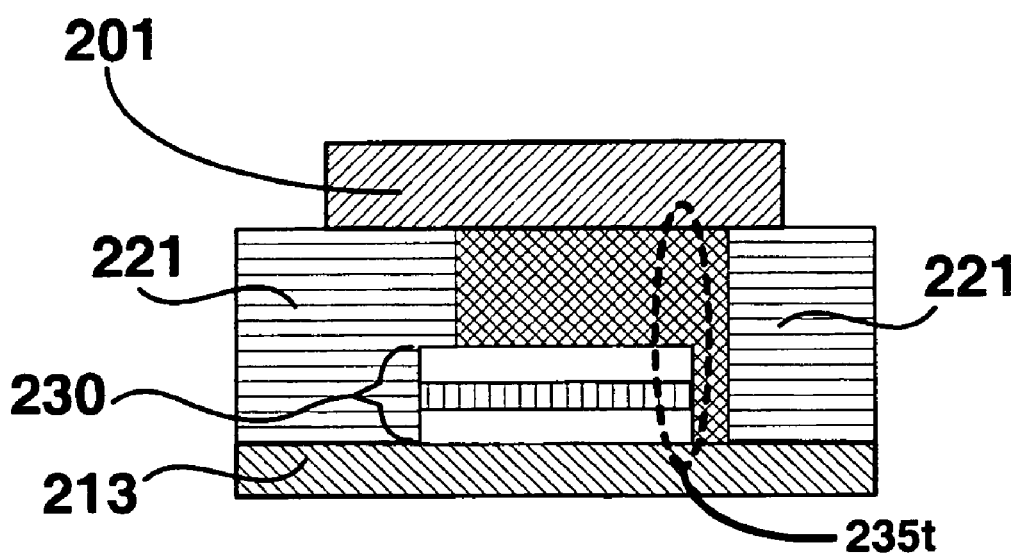
Figure 5A:
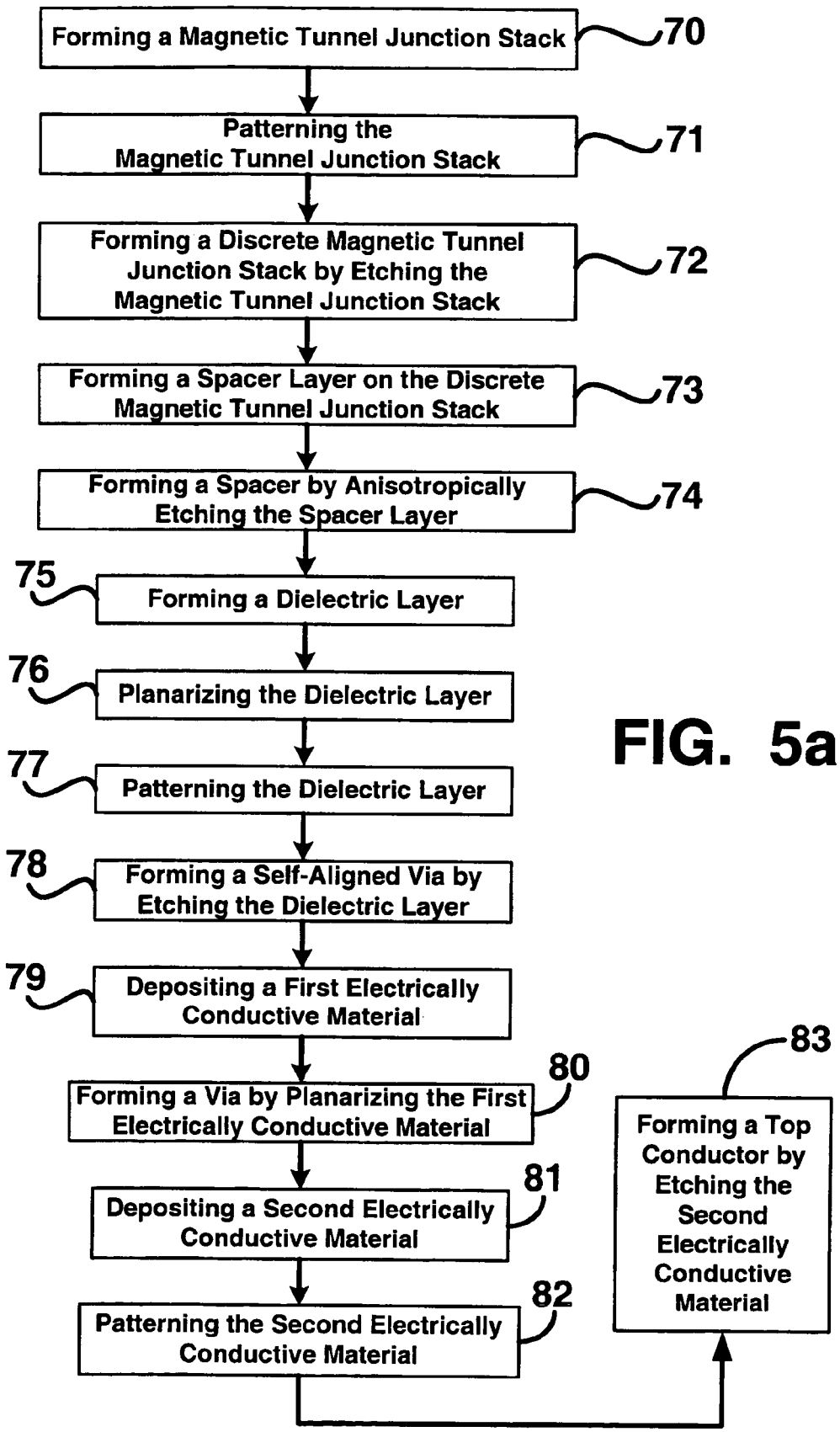
FIG. 5a is a flow diagram depicting a method of making a magnetic tunnel junction device.

As shown in the drawings for purpose of illustration, the present invention is embodied in a method of making a magnetic tunnel junction device. In FIG. 5a, a first embodiment of the method includes forming a magnetic tunnel junction stack 70, and then patterning the magnetic tunnel junction stack 71. A discrete magnetic tunnel junction stack is formed 72 by etching the magnetic tunnel junction stack, then a spacer layer is formed 73 on the discrete magnetic tunnel junction stack, and a spacer is formed 74 by aniso-tropically etching the spacer layer. A dielectric layer is formed 75 on the spacer and the discrete magnetic tunnel junction stack followed by planarizing 76 the dielectric layer. The dielectric layer is patterned 77 and then a self-aligned via is formed 78 by etching the dielectric layer. A first electrically conductive material is deposited 79 in the self-aligned via and on the dielectric layer. The first electrically conductive material is then planarized 80 to form a via. A second electrically conductive material is deposited 81 on the dielectric layer and the via, followed by patterning 82 the second electrically conductive material. A top conductor is formed 83 by etching the second electrically conductive material.

Figure 5B:
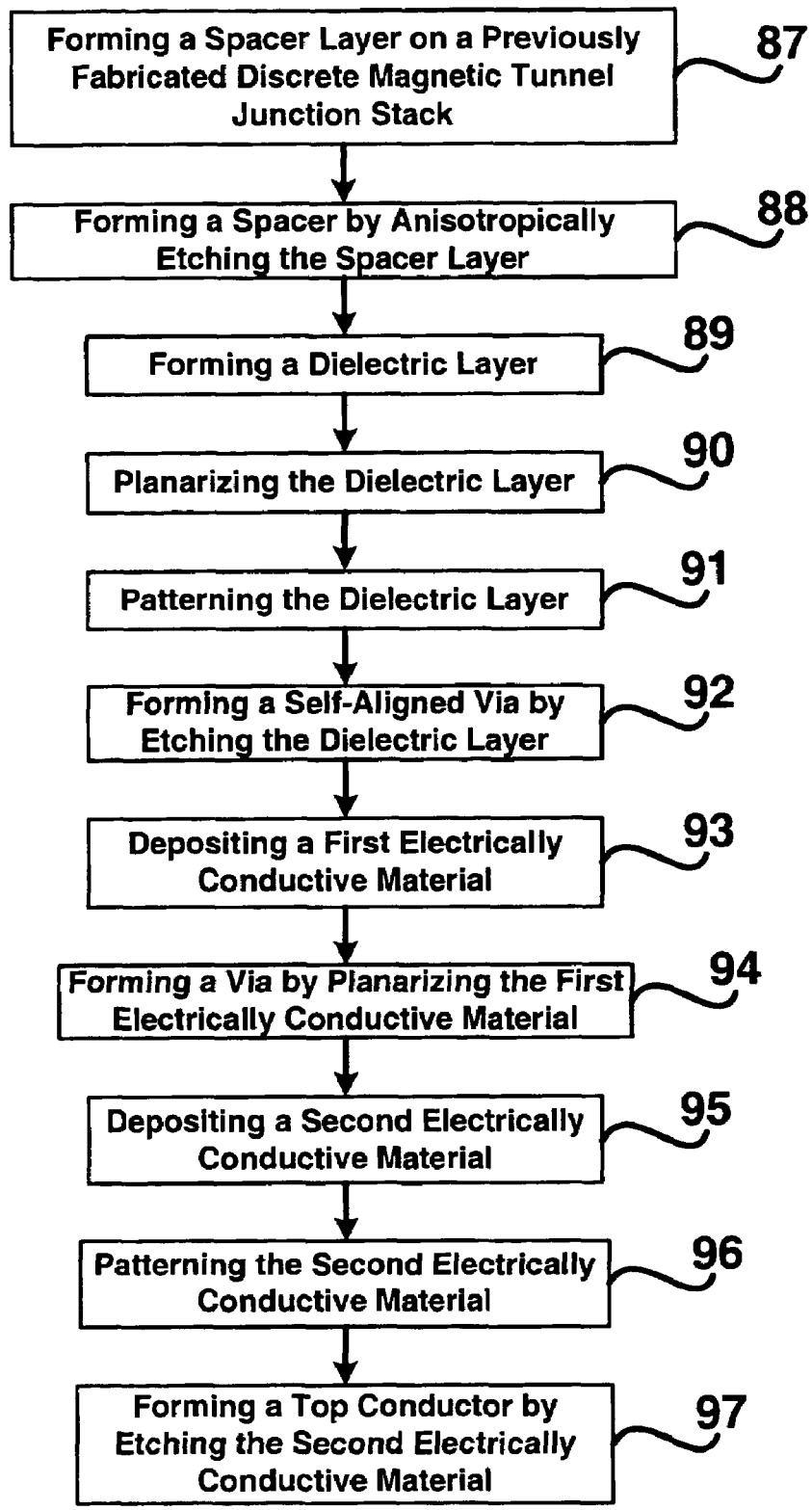
FIG. 5b is a flow diagram depicting an alternative method of making a magnetic tunnel junction device.

In FIG. 5b, a second embodiment of the method includes forming 87 a spacer layer on a previously formed discrete magnetic tunnel junction stack and forming 88 a spacer by anisotropically etching the spacer layer. A dielectric layer is formed 89 on the spacer and the discrete magnetic tunnel junction stack followed by planarizing 90 the dielectric layer. The dielectric layer is patterned 91 and then a via is formed 92 by etching the dielectric layer. A first electrically conductive material is deposited 93 in the self-aligned via and on the dielectric layer. The first electrically conductive material is then planarized 94 to form a via. A second electrically conductive material is deposited 95 on the dielectric layer and the via, followed by patterning 96 the second electrically conductive material. A top conductor is formed 97 by etching the second electrically conductive material.

Figure 6:
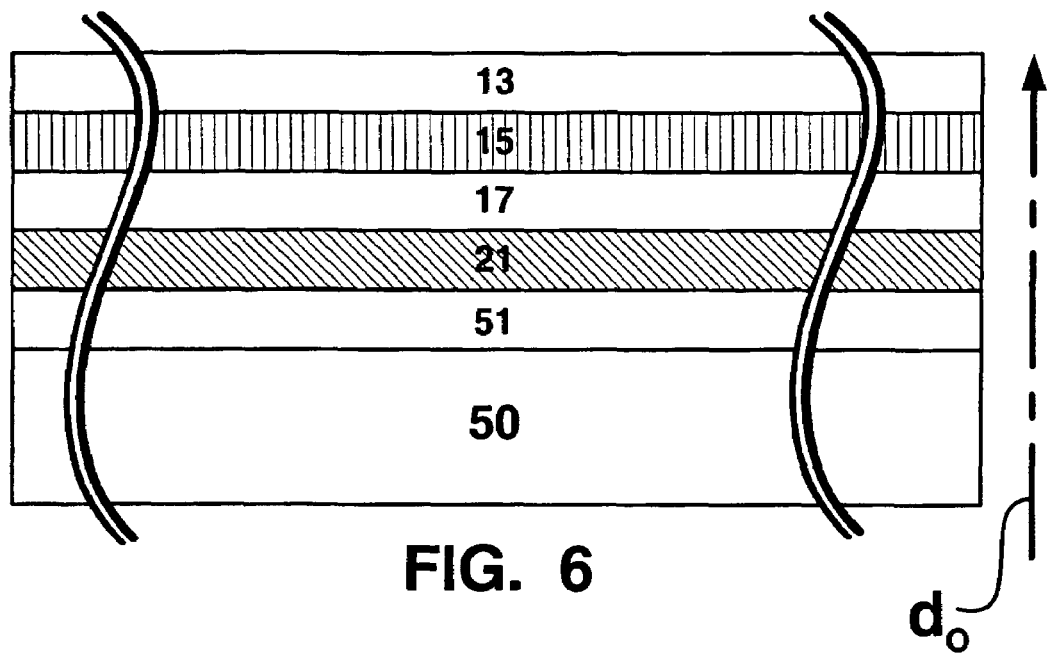
FIG. 6 is a cross-sectional view depicting a magnetic tunnel junction stack.

In FIG. 6 and referring to the above mentioned first embodiment of the method as depicted in FIG. 5a, at a stage 70, a magnetic tunnel junction stack 60 is formed. The magnetic tunnel junction stack 60 includes a plurality of layers of thin film materials that are well known in the MRAM art. Those layers include but are not limited to a substrate 50, a dielectric layer 51, an electrically conductive material 21, a reference layer 17, a tunnel barrier layer 15, and a data layer 13.

The substrate 50 can be a semiconductor material such as single crystal silicon (Si) or a silicon (Si) wafer, for example. The dielectric layer 51 can be deposited on the substrate 50 or grown on the substrate 50. For example, a surface of a silicon wafer can be oxidized to grow a layer of silicon oxide ($SiO_2$) for the dielectric layer 51. The electrically conductive material 21 can be a bottom conductor that serves as one of the write lines and can be made from a material including but not limited to aluminum (Al) and tungsten (W), for example. The reference layer 17 can be a thin film layer of a magnetic material such as nickel iron (NiFe) or alloys of those materials, for example. The tunnel barrier layer 15 can be a thin film layer of a dielectric material such as aluminum oxide ($Al_2O_3$) or silicon oxide ($SiO_2$) for a TMR device or a thin film layer of an electrically conductive material such as copper (Cu) for a GMR device, for example. The data layer 13 can be a thin film layer of a magnetic material such as nickel iron cobalt (NiFeCo) or alloys of those materials, for example. The above mentioned layers are referred to as thin film layers because most of the layers of material that are used to fabricate a tunnel junction device have thicknesses on the order of about 15.0 nm of less.

In FIG. 6, the plurality of layers of thin film materials are deposited or otherwise formed on the substrate 50 in a deposition order $d_O$. For purposes of illustration, other layers that can be included in a magnetic tunnel junction device, such as cap layers, seed layers, pinning films, artificial anti-ferromagnetic layers, and the like, are not depicted in FIG. 6. However, those layers can be included in the magnetic tunnel junction stack 60. Deposition processes that are well known in the microelectronics art can be used to deposit the layers in the magnetic tunnel junction stack 60. For example, physical vapor deposition (PVD), plasma enhanced chemical vapor deposition (PECVD), and sputtering are processes that can be used to form the aforementioned layers. PVD can include thermal evaporation and sputtering.

Figure 7A:
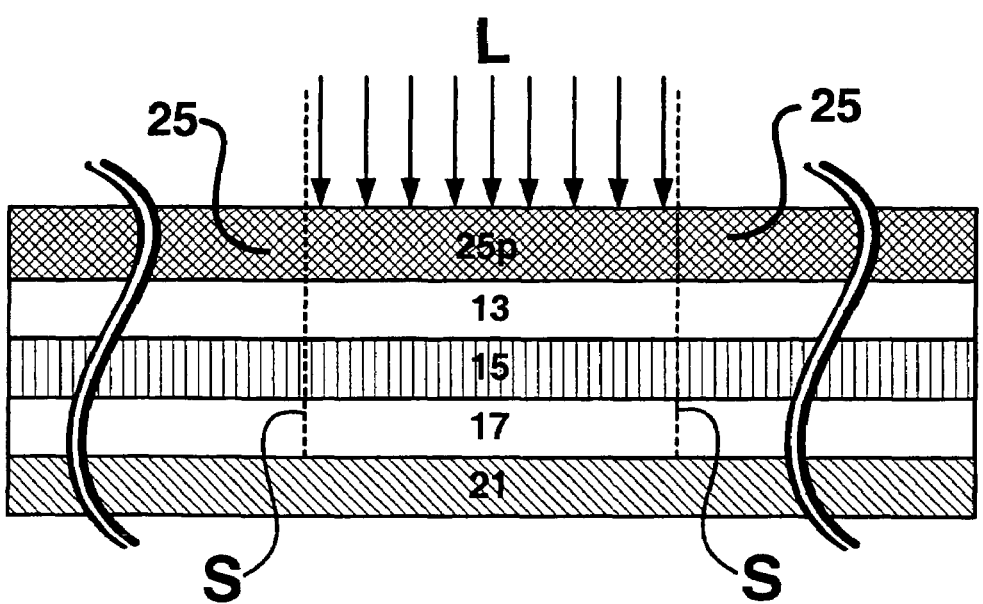
FIG. 7a is a cross-sectional view depicting a patterning of a magnetic tunnel junction stack.

In FIG. 7*a*, at a stage 71, the magnetic tunnel junction stack 60 is patterned. As an example, a first mask layer 25 of a photoresist material that can be deposited on the data layer 13. At a 72, the first mask layer 25 is then patterned to form a predetermined pattern in the first mask layer 25. For instance, the photoresist material can be exposed to light L, using photolithographic processes that are well known in the microelectronics art to cause the exposed portion to harden or otherwise alter the properties of the material for the first mask layer 25 so that exposed portion forms an etch resistant pattern or etch mask.

Figure 7B:
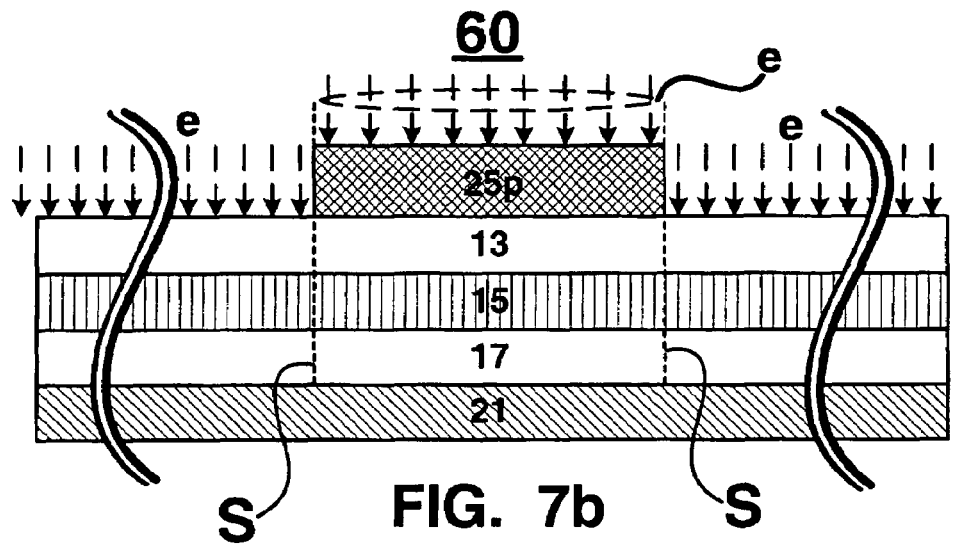
FIG. 7b is a cross-sectional view depicting an etching of a magnetic tunnel junction stack.

Accordingly, in FIG. 7*a*, a patterned portion 25*p* of the first mask layer 25 that is exposed to the light L forms an etch mask that will be used during an etch process to form a discrete stack out of the magnetic tunnel junction stack 60 as denoted by the dashed lines S. After the exposure to the light L and prior to the etching process, the first mask layer 25 is developed to remove those portions not exposed to the light L so that the patterned portion 25*p* of the of the first mask layer 25 remains on the magnetic tunnel junction stack 60 as depicted in FIG. 7*b*. Hereinafter, the patterned portion 25*p* of the of the first mask layer 25 will be denoted as the first mask layer 25*p*.

In FIG. 7*b*, at a stage 72, the magnetic tunnel junction stack 60 is etched e to remove those portions of the magnetic tunnel junction stack 60 that are not covered by the first mask layer 25*p*. As a result, in FIG. 8*a*, a discrete magnetic tunnel junction stack 20 is formed substantially along the dashed lines S of FIGS. 7*a* and 7*b*. The layers (13, 15, 17) of the discrete magnetic tunnel junction stack 20 that are positioned under the first mask layer 25*p*, unless otherwise noted, will be collectively denoted as the layers 30.

An etch process such as a wet etch or a plasma etch can be used to form the discrete magnetic tunnel junction stack 20, for example. The etch material can be selected such that it selectively etches the layers (13, 15, 17) of the magnetic tunnel junction stack 60 but is not selective to the bottom conductor 21 so that the bottom conductor 21 serves as an etch stop layer. Alternatively, the etch process can be controlled to halt the etching at a predetermined time. Although not shown, the etch process can etch through the bottom conductor 21.

Figure 8A:
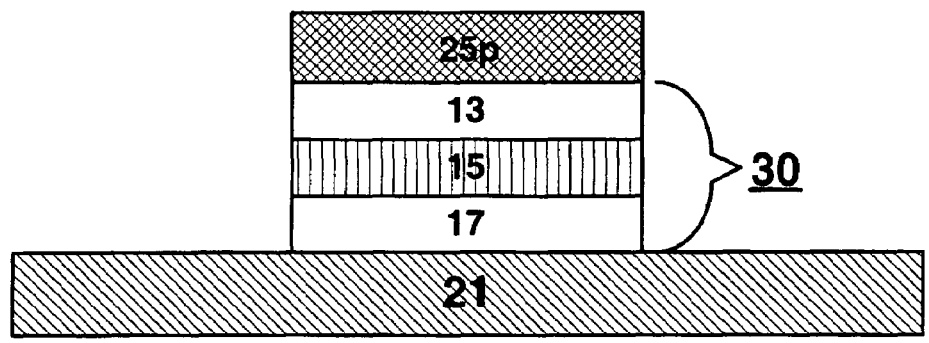
FIG. 8a is a cross-sectional view depicting a discrete magnetic tunnel junction stack.
Figure 8B:
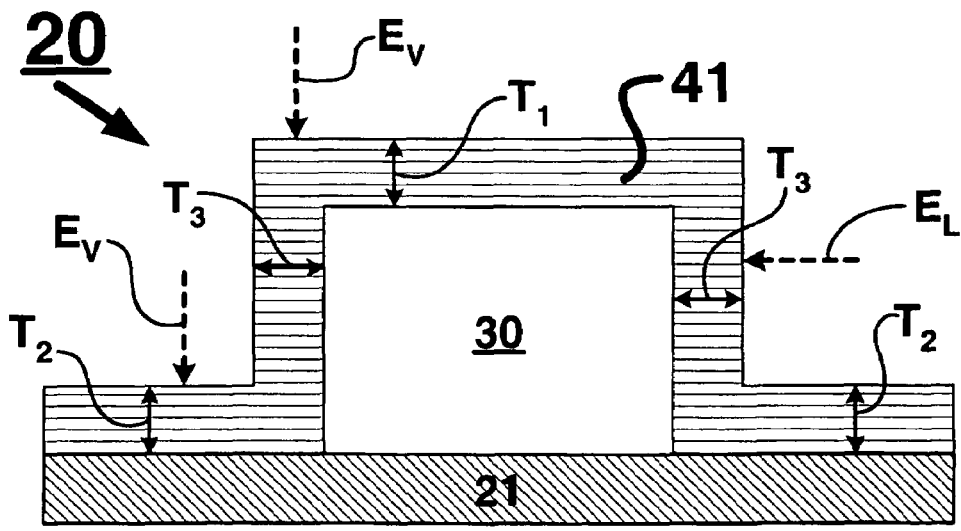
FIG. 8b is a cross-sectional view depicting a forming of a spacer layer over a discrete magnetic tunnel junction stack.

In FIG. 8*b*, at a stage 73, a spacer layer 41 is formed on the discrete magnetic tunnel junction stack 20. The spacer layer 41 is made from an electrically non-conductive material. Suitable materials for the spacer layer 41 include but are not limited to silicon oxide ($SiO_2$) and silicon nitride ($Si_3N_4$). Preferably, the spacer layer 41 is conformally deposited on the discrete magnetic tunnel junction stack 20 so that a thickness of the spacer layer 41 is substantially uniform on all sides of the discrete magnetic tunnel junction stack 20 that are covered by the spacer layer 41. For example, thicknesses ($T_1$, $T_2$, and $T_3$) on top, bottom, and side portions of the discrete magnetic tunnel junction stack 20 are substantially equal to one another such that after the conformal deposition $T_1 \approx T_2 \approx T_3$. That is, the lateral growth rate of the material for the spacer layer 41 is substantially equal to the vertical growth rate of the material resulting in horizontal ($T_1$, $T_2$) and vertical ($T_3$) sidewall thicknesses that are substantially equal to one another.

Figure 9:
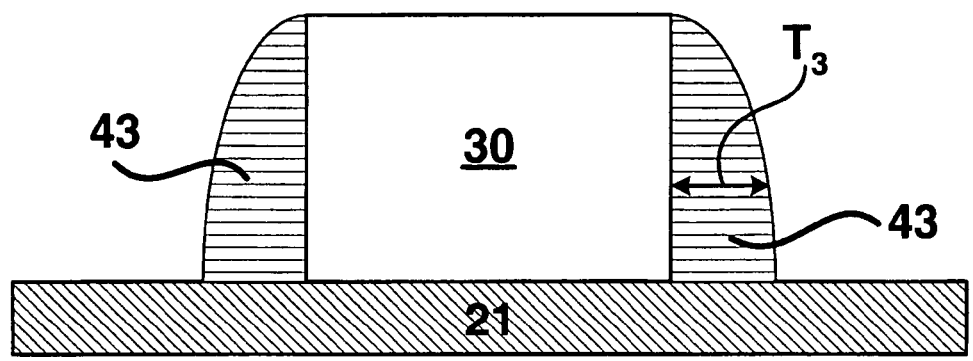
FIG. 9 is a cross-sectional view depicting a discrete magnetic tunnel junction stack and a spacer.

In FIG. 9, at a stage 74, the spacer layer 41 is anisotropically etched to form a spacer 43 that is in contact with a portion of the discrete magnetic tunnel junction stack 20. Preferably, the etching of the spacer layer 41 is accomplished using an anisotropic etching process that includes an etch material that has a faster etch rate in a preferred etch direction $E_V$ (see FIG. 8*b*). For example, a reactive ion etching (RIE) process can be used to etch the spacer layer 41.

In FIG. 8*b*, the preferred etch direction $E_V$ is in a substantially vertical direction; whereas, an non-preferred etch direction $E_L$ is in a substantially lateral direction. As a result, the anisotropic etching process etches the spacer layer 41 faster in the preferred etch direction $E_V$ so that after the etch process, the material of the spacer layer 41 along the horizontal thicknesses ($T_1$, $T_2$) is removed and the material along vertical thickness $T_3$ remains and forms the spacer 43. Deposition processes that are well known in the microelectronics arts, such as chemical vapor deposition (CVD), plasma enhanced chemical vapor deposition (PECVD), and atomic layer deposition (ALD) can be used to deposit the spacer layer 41 on the discrete magnetic tunnel junction stack 20 and the bottom conductor 21.

Figure 10A:
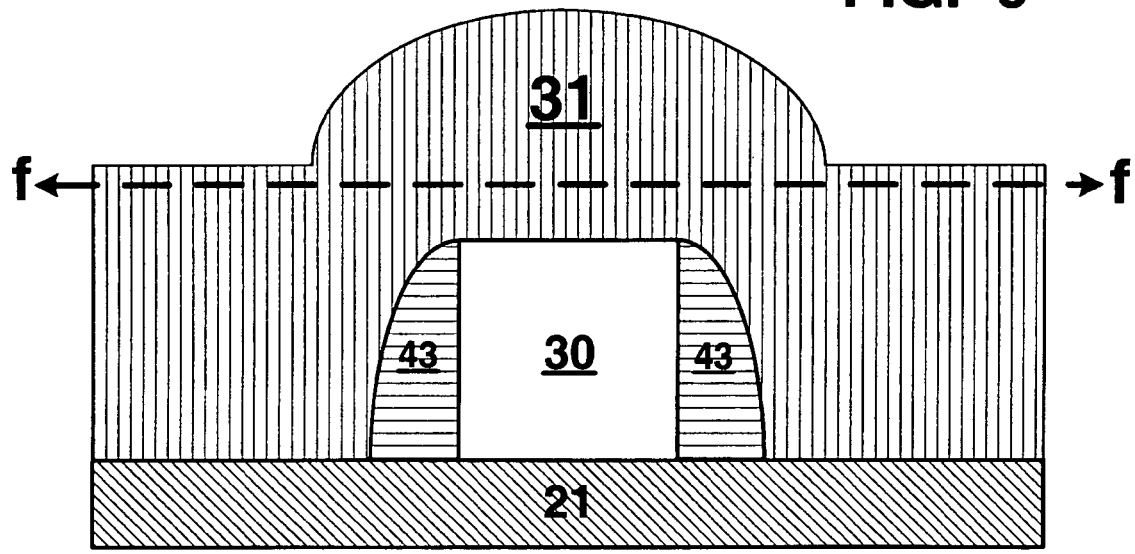
FIG. 10a is a cross-sectional view depicting a dielectric layer formed on the discrete magnetic tunnel junction stack of FIG. 9.
Figure 10B:
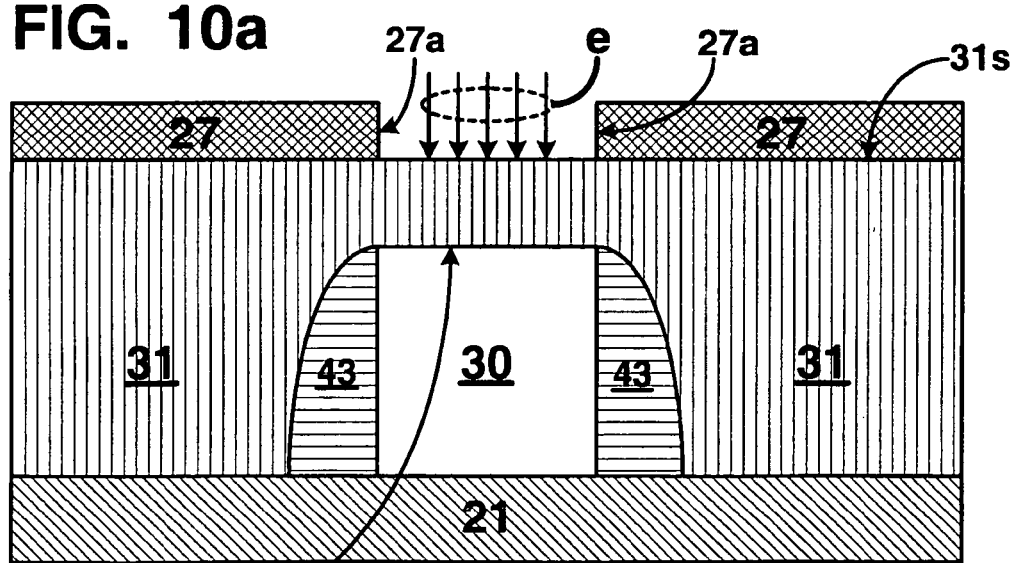
FIGS. 10b through 10d are cross-sectional views depicting a planarization, a patterning, and an etching of the dielectric layer.

In FIG. 10*a*, at a stage 75, a dielectric layer 31 is formed over the discrete magnetic tunnel junction stack 20 and the spacer 43. Suitable materials for the dielectric material 31 include but are not limited to silicon oxide ($SiO_2$) and silicon nitride ($Si_3N_4$). The dielectric material 31 completely covers the discrete magnetic tunnel junction stack 20 and the spacer 43. In FIG. 10*b*, at a stage 76, the dielectric layer 31 is planarized to form a substantially planar surface 31*s*. Preferably, the dielectric layer 31 is planarized along a line f—f (see FIG. 10*a*). A process including but not limited to chemical mechanical planarization (CMP) can be used to planarize the dielectric layer 31.

In FIG. 10*b*, at a stage 77, the dielectric layer 31 is patterned in a manner similar to the first mask layer 25 as was described above in reference to FIGS. 7*a* and 7*b*. For example, a layer of photoresist 27 can be applied to the dielectric layer 31, lithographically exposed through mask to form a pattern, and then the pattern can be developed to form an aperture 27*a* over the dielectric layer 31 that exposes a portion of the dielectric layer 31 for a subsequent etching process.

Figure 10C:
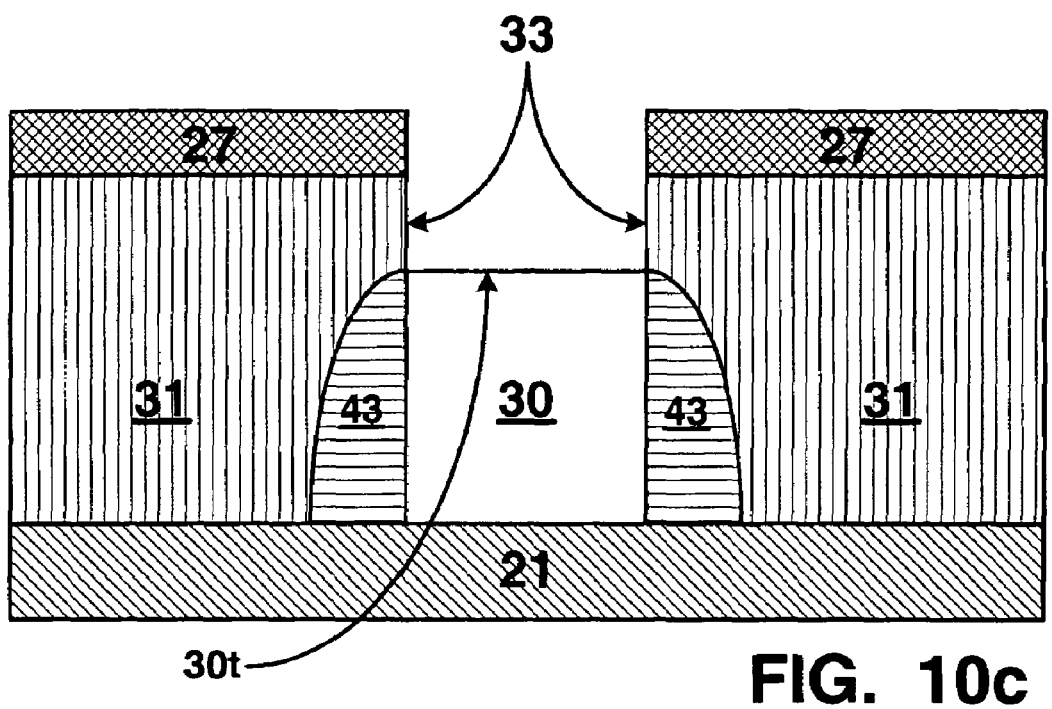
Figure 10D:
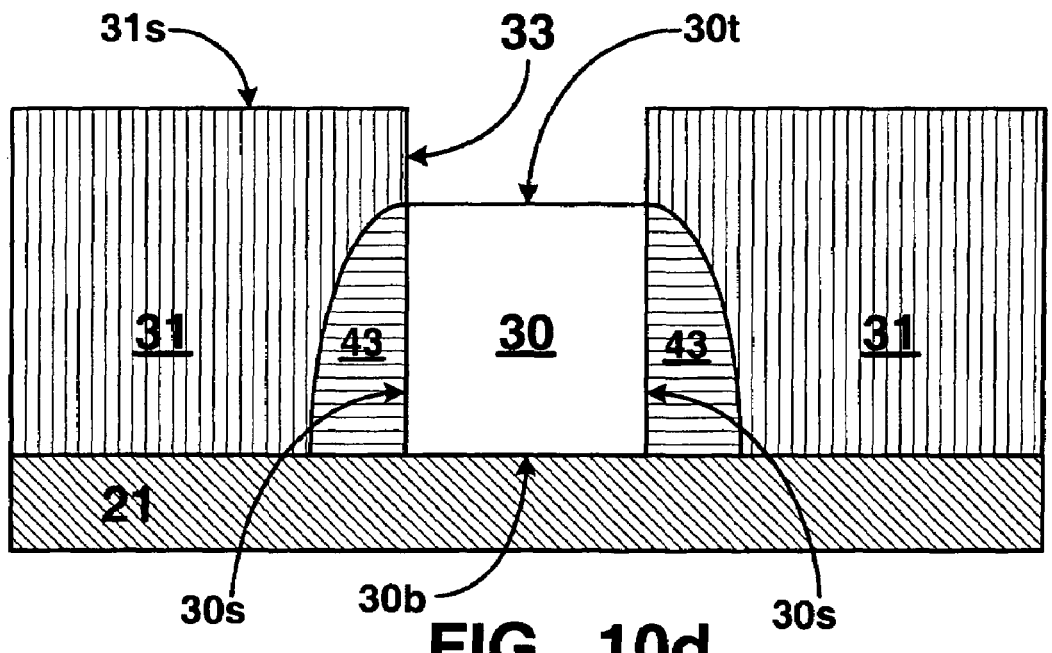

In FIGS. 10*b* through 10*d*, at a stage 78, the dielectric layer 31 is etched e to form a self-aligned via 33 in the dielectric layer 31. The etching e is continued until the self-aligned via 33 extends to a top portion 30*t* of the layers 30. After the etching e, the layers 30 includes the top portion 30*t* that is positioned at a bottom most portion of the self-aligned via 33, side portions 30*s* that are in contact with the spacer 43, and a bottom portion 30*b* that is in contact with the bottom conductor 21. The etch process for the etching e can be a plasma etch or a wet etch, for example.

Figure 11:
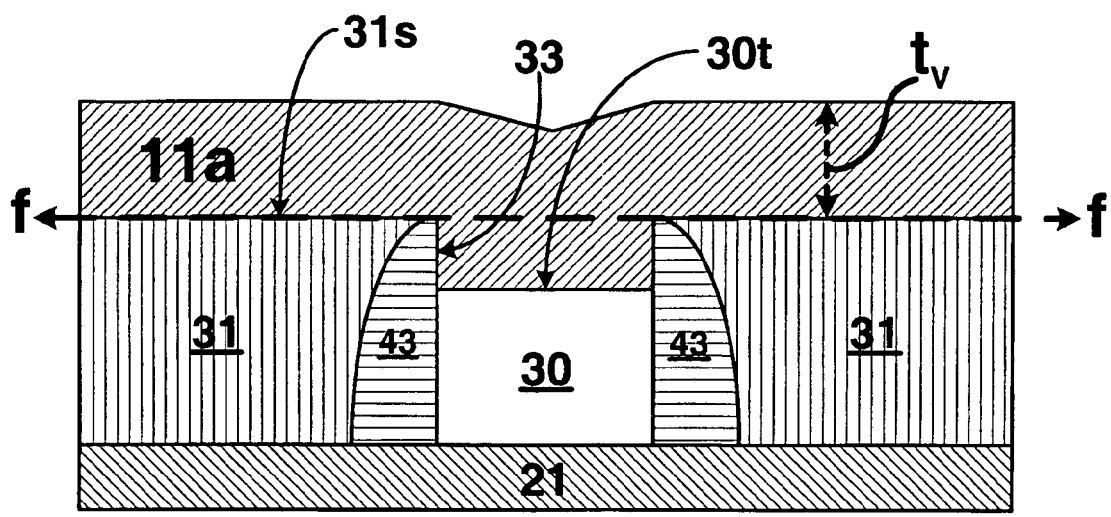
FIG. 11 is a cross-sectional view depicting a first electrically conductive material deposited on a dielectric layer and in a self-aligned via.

In FIG. 11, at a stage 79, a first electrically conductive material 11*a* is deposited on the dielectric layer 31 and in the self-aligned via 33. Preferably, the depositing of the first electrically conductive material 11*a* continues until the first electrically conductive material 11*a* completely fills the self-aligned via 33. The complete filling of the self-aligned via 33 ensures that a via (i.e. that portion of 11*a* that is positioned in the self-aligned via 33) is in contact with the top portion 30*t*. After the deposition, the first electrically conductive material 11*a* can extend outward of the substantially planar surface 31*s* by a thickness $t_V$. A process including but not limited to physical vapor deposition (PVD), sputtering, or plasma enhanced chemical vapor deposition (PECVD) can be used to deposit the first electrically conductive material 11a, for example. Suitable materials for the first electrically conductive material 11a include but are not limited to aluminum (Al), alloys of aluminum, tungsten (W), alloys of tungsten, copper (Cu), and alloys of copper. If copper (Cu) is used for the first electrically conductive material 11a, then a process such as electroplating can be used for a deposition of the copper.

Figure 12:
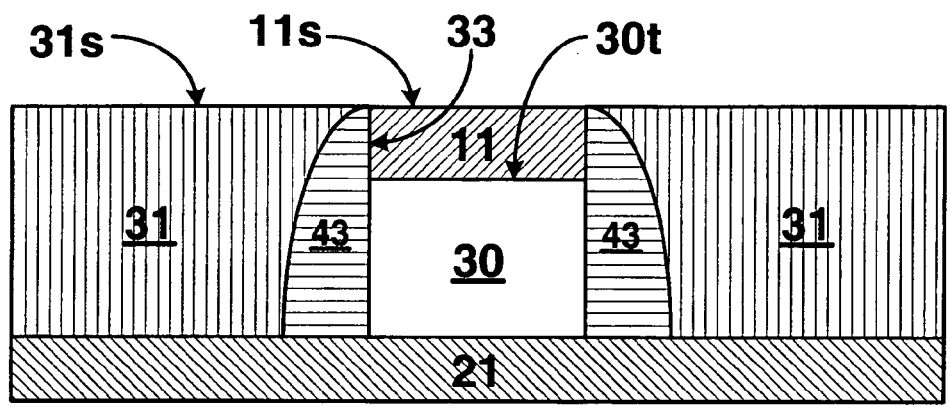
FIG. 12 is a cross-sectional view depicting a planarization of the first electrically conductive material.

In FIG. 12, at a stage 80, the first electrically conductive material 11a is planarized to form a via 11 that is positioned in the self-aligned via 33. Preferably, the first electrically conductive material 11a is planarized along a line f—f (see FIG. 11) so that after the planarization, the via 11 has a substantially planar surface 11s that is flush with the substantially planar surface 31s of the dielectric layer 31 (e.g. the thickness $t_V$ is substantially reduced). A process including but not limited to chemical mechanical planarization (CMP) can be used to planarize the first electrically conductive material 11a.

Figure 13:
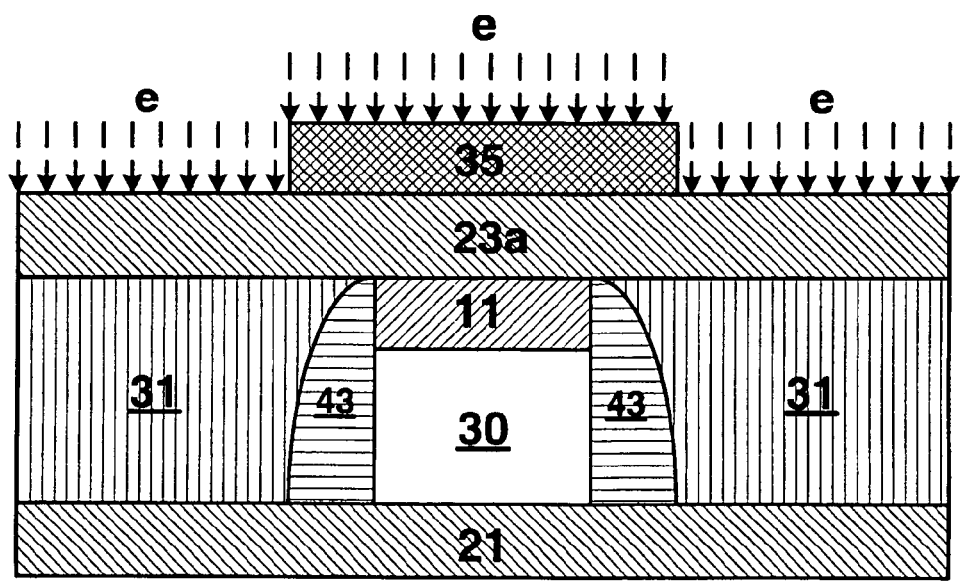
FIG. 13 is a cross-sectional view depicting a deposition of a top conductor.

In FIG. 13, at a stage 81, a second electrically conductive material 23a is deposited on the dielectric layer 31 and on the via 11. Suitable materials for the second electrically conductive material 23a include but are not limited to aluminum (Al), alloys of aluminum, tungsten (W), alloys of tungsten, copper (Cu), and alloys of copper. A process including but not limited to physical vapor deposition (PVD), sputtering, or plasma enhanced chemical vapor deposition (PECVD) can be used to deposit the second electrically conductive material 23a, for example.

In FIG. 13, at a stage 82, the second electrically conductive material 23a is patterned. As was described above in reference to FIGS. 7a and 10b, the patterning can be a photoresist material or other masking material that covers a portion of the second electrically conductive material 23a so that a remainder of the second electrically conductive material 23a can be etched away. For example, a photoresist material can be deposited on the second electrically conductive material 23a, photolithographically patterned, and then developed to form a mask 35.

Figure 14:
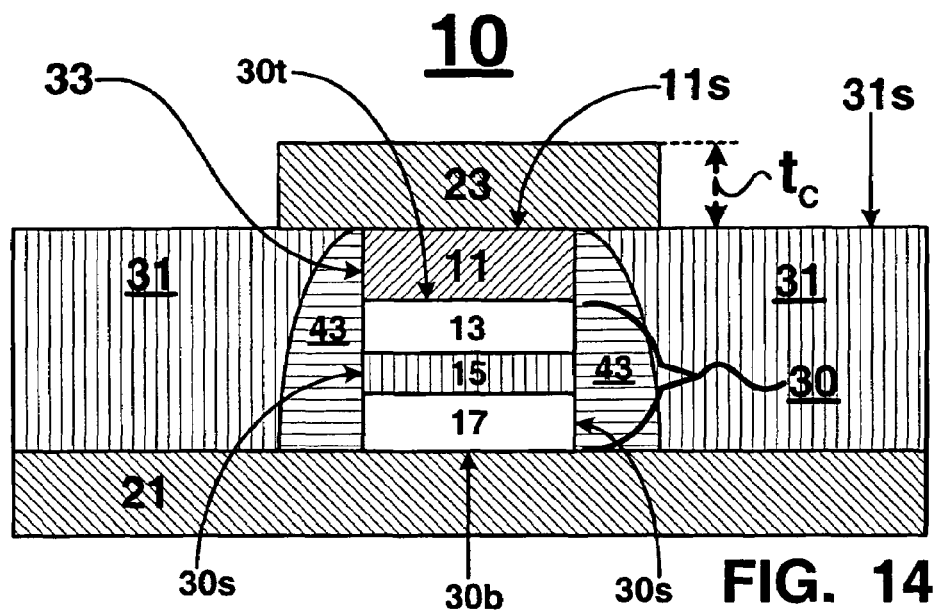
FIG. 14 is a cross-sectional view depicting a magnetic tunnel junction device.

In FIGS. 13 and 14, at a stage 83, the second electrically conductive material 23a is etched e to remove excess portions of the second electrically conductive material 23a. The etching e forms a top conductor 23. The top conductor 23 is in contact with a portion of the substantially planar surface 31s and is in contact with a portion of the via 11. The top conductor 23 can extend outward of the substantially planar surface 31s by a thickness $t_C$. Preferably, the top conductor 23 covers an entirety of the substantially planar surface 11s of the via 11.

In FIG. 14, a magnetic tunnel junction device 10 is formed and includes the top conductor 23, the bottom conductor 21, the reference layer 17, the data layer 13, and the tunnel barrier layer 15. The reference layer 17 is in electrical communication with the bottom conductor 21 and the data layer 13 is in contact with the via 11. The electrical communication between the bottom conductor 21 and whatever layer is at the bottom portion 30b can be by a direct connection or through an intermediate structure such as a via or the like. In FIG. 14, the bottom conductor 21 is in contact with the bottom portion 30b; however, the bottom conductor 21 need not be in direct contact with the bottom portion 30b. The top conductor 23 is in electrical communication with the top portion 30t through the via 11. The order of the layers 30 (e.g. thin film layers 17, 15, 13) need not be as depicted in FIG. 14, for example, the data layer 13 can be positioned at the bottom portion 30b, the reference layer 17 can be positioned at the top portion 30t, and the tunnel barrier layer 15 can be positioned between the data and reference layers (13, 17).

Figure 15A:
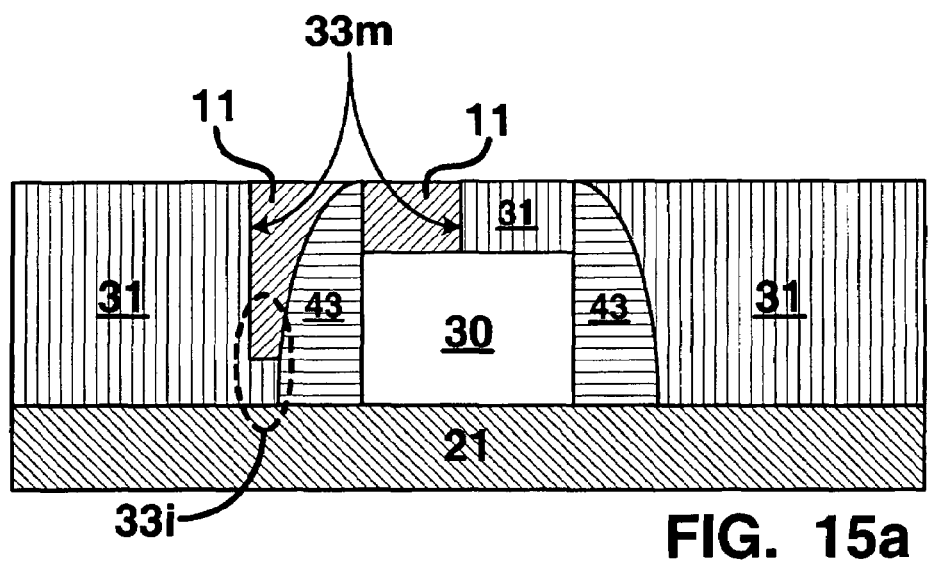
FIGS. 15a and 15b are cross-sectional views depicting a self-aligned via that is not aligned relative to a discrete magnetic tunnel junction stack.
Figure 15B:
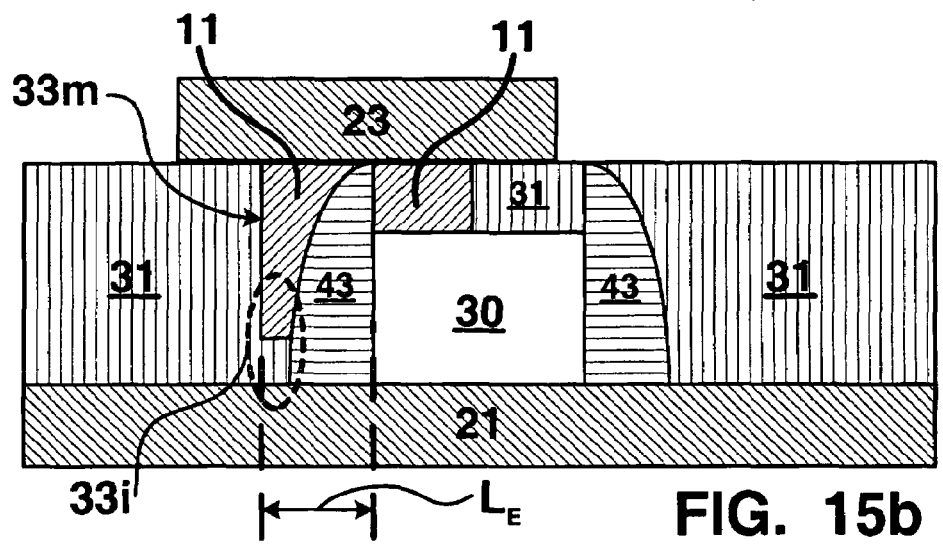

In FIGS. 15a and 15b, another advantage of the method is that a misalignment of the self-aligned via 33 relative to the layers 30 of the discrete magnetic tunnel junction stack 20 does not automatically result in a short circuit or a defect in the magnetic tunnel junction device 10. Because the process used to fabricate the magnetic tunnel junction device 10 are not perfect, misalignment errors caused by the lithographic processes and the etching processes, just to name a few, usually result in the self-aligned via 33 being misaligned relative to the layers 30.

In FIG. 15a, a self-aligned via 33m is misaligned relative to the layers 30. After the first electrically conductive material 11a is deposited in the self-aligned via 33m, the misalignment results in a region 33i between the spacer 43 and the dielectric layer 31 that prevents the via 11 from electrically communicating with the layers 30 and/or the bottom conductor 21.

In FIG. 15b, after the top conductor 23 is formed, the top conductor 23 is not in electrical communication with the bottom conductor 21 and/or the side portions 30s of the layers 30 because the spacer 43 provides a lateral error margin $L_E$ that allows the via 11 to be misaligned relative to the layers 30. Consequently, the via 11 does not extend all the way to the bottom conductor 21 so that the top conductor 23 is not shorted to the bottom conductor 21. Furthermore, the lateral error margin $L_E$ provided by the spacer 43 prevents the via 11 from connecting with the side portions 30s of the layers 30.

In FIG. 8b and referring to the above mentioned second embodiment of FIG. 5b, the magnetic tunnel junction device 10 can be fabricated as was described above in reference to FIGS. 8b through 15b. However, instead of forming the magnetic tunnel junction stack 60 as depicted in FIGS. 5a and 6, and then forming the discrete magnetic tunnel junction stack 20 as depicted in FIGS. 7a through 8a, a previously fabricated discrete magnetic tunnel junction stack 20 is provided and the spacer layer 41 is formed on the previously fabricated discrete magnetic tunnel junction stack 20. Accordingly, the stages 70 through 72 as depicted in FIG. 5a, have been previously performed to fabricate the discrete magnetic tunnel junction stack 20.

The previously fabricated discrete magnetic tunnel junction stack 20 can include the first mask layer 25p (see FIG. 8a). A plurality of the previously fabricated discrete magnetic tunnel junction stacks 20 can be carried by the substrate 50, and in a subsequent phase of fabrication, the remaining process steps for forming the magnetic tunnel junction device 10 can be carried out according to the steps of FIG. 5b (i.e. stages 87 through 97) and as depicted in FIG. 8b through FIG. 15b.

Figure 16:
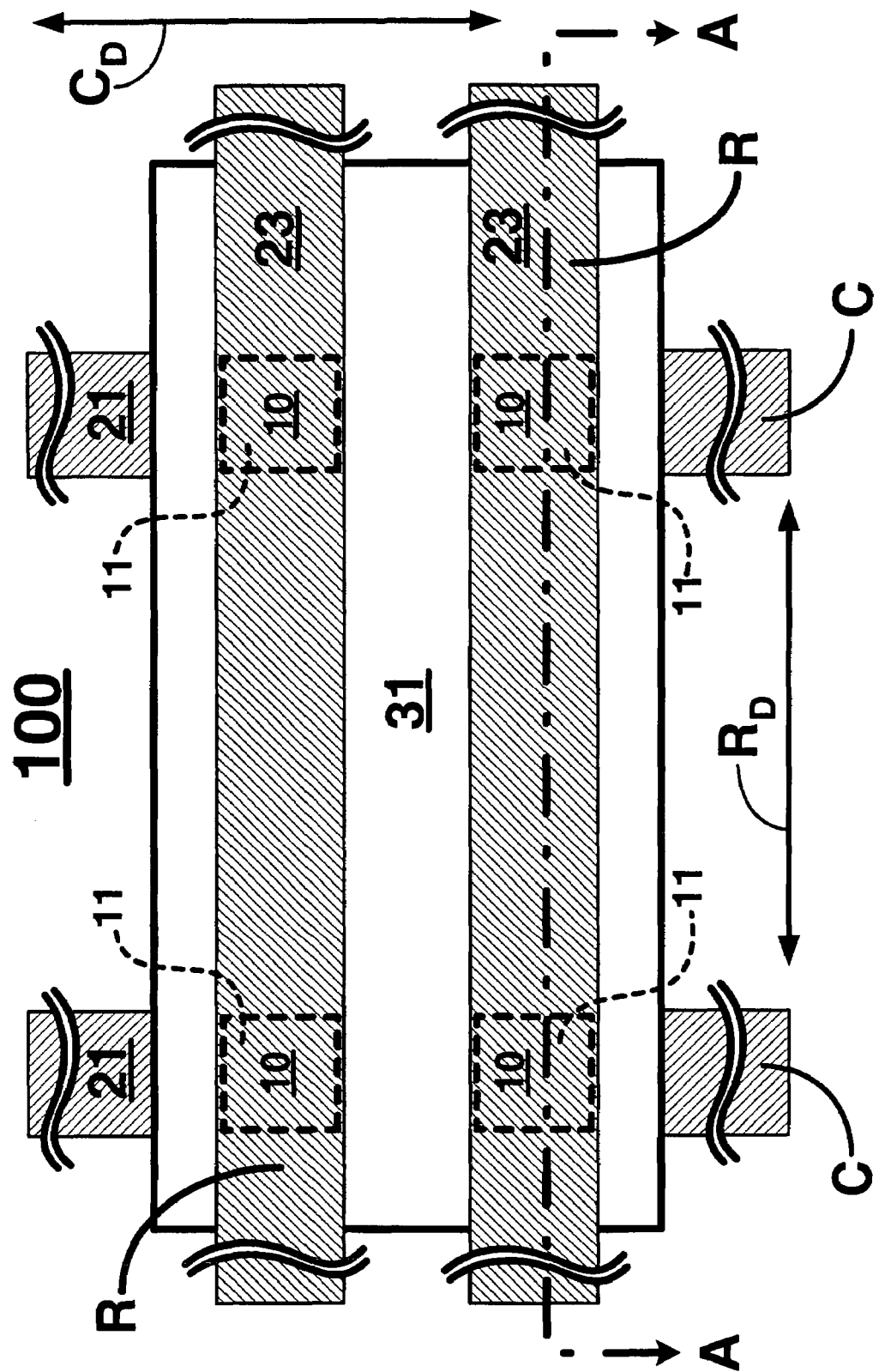
FIG. 16 is a top plan view of an array of magnetic tunnel junction devices.

In FIG. 16, a plurality of the magnetic tunnel junction devices 10 can be configured in an array 100. The array 100 can be a MRAM used to store and retrieve data written to the plurality of magnetic tunnel junction devices 10. The bottom conductor 21 can be a column conductor C that is aligned with a column direction $C_D$ and the top conductor 23 can be a row conductor R that is aligned with a row direction $R_D$. Alternatively, although not depicted in FIG. 16, one of ordinary skill in the art will understand that the bottom conductor 21 can be the row conductor R and the top conductor 23 can be the column conductor C. The magnetic tunnel junction devices 10 are positioned between an intersection of the row and column conductors (R, C) as depicted by the dashed lines 10.

In FIG. 16, the top conductor 23 is depicted aligned with the row direction $R_D$; however, the via 11 is not visible in the view depicted in FIG. 16. Typically, the row R and column C conductors are positioned in orthogonal relation to each other so that they cross each of the magnetic tunnel junction devices 10 at substantially right angles to each other. Accordingly, the row and column conductors (R, C) define the rows and columns of the array 100 and the magnetic tunnel junction devices 10 are positioned in the rows R and columns C of the array 100.

In FIG. 17, a cross-sectional view of the array 100 along a line A—A of FIG. 16 (i.e. along the row direction $R_D$) depicts the top conductor 23 running along the row direction $R_D$ with the via 11 in contact with the data layers 13 of the magnetic tunnel junction devices 10 in the row R. Similarly, the column conductors C are electrical communication with the reference layers 17 in their respective columns. The electrical communication can be by direct contact with the reference layers 17 or by an intermediate structure such as a via (not shown) or the like. Although not depicted in FIGS. 16 and 17, the self-aligned via 33 can be misaligned with the layers 30 as described above in reference to FIGS. 15a and 15b.

Although several embodiments of the present invention have been disclosed and illustrated, the invention is not limited to the specific forms or arrangements of parts so described and illustrated. The invention is only limited by the claims.

What is claimed is:

1. A magnetic tunnel junction device, comprising:
    a discrete magnetic tunnel junction stack including a top portion, a bottom portion, and a side portion;
    an electrically non-conductive spacer in contact with the side portion;
    a dielectric layer surrounding the spacer and including a self-aligned via that extends to the top portion;
    a via positioned in the self-aligned via and in contact with the top portion;
    a bottom conductor in electrical communication with the bottom portion; and
    a top conductor in contact with the via.

2. The magnetic tunnel junction device as set forth in claim 1, wherein the spacer is made from a material selected from the group consisting of silicon oxide and silicon nitride.

3. The magnetic tunnel junction device as set forth in claim 1, wherein the self-aligned via and the magnetic tunnel junction stack are not aligned relative to each other.

4. The magnetic tunnel junction device as set forth in claim 1 and further comprising:
    a plurality of the magnetic tunnel devices positioned in a plurality of rows and a plurality of columns of an array;
    a plurality of row conductors that are aligned with a row direction of the array; and
    a plurality of column conductors that are aligned with a column direction of the array,
    each of the plurality of the magnetic tunnel junction devices is positioned between an intersection of one of the row conductors with one of the column conductors,
    wherein the plurality of row conductors comprises a selected one of the top conductor or the bottom conductor, and
    wherein the plurality of column conductors comprises a selected one of the top conductor or the bottom conductor.

5. The magnetic tunnel junction device as set forth in claim 4, wherein the array is a MRAM array.

6. The magnetic tunnel junction device as set forth in claim 4, wherein the self-aligned via and the magnetic tunnel junction stack are not aligned relative to each other.

* * * * *